United States Patent
Ananthanarayanan et al.

(10) Patent No.: US 6,829,548 B2
(45) Date of Patent: Dec. 7, 2004

(54) DLL STATIC PHASE ERROR MEASUREMENT TECHNIQUE

(75) Inventors: Priya Ananthanarayanan, Cupertino, CA (US); Pradeep R. Trivedi, Sunnyvale, CA (US); Claude R. Gauthier, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/406,541

(22) Filed: Apr. 3, 2003

(65) Prior Publication Data

US 2004/0199345 A1 Oct. 7, 2004

(51) Int. Cl.[7] .............................................. G06F 11/00
(52) U.S. Cl. ........................ 702/72; 714/815; 713/500
(58) Field of Search ................................. 327/156, 158; 714/798, 811, 815, 816; 713/500, 503; 702/72, 79, 89; 375/375, 376; 324/76.52–76.54, 76.77

(56) References Cited

U.S. PATENT DOCUMENTS

| | | | |
|---|---|---|---|
| 5,815,016 A | * | 9/1998 | Erickson ...................... 327/158 |
| 6,194,916 B1 | * | 2/2001 | Nishimura et al. ........... 327/12 |
| 6,448,756 B1 | * | 9/2002 | Loughmiller ............ 324/76.54 |
| 6,470,060 B1 | * | 10/2002 | Harrison ...................... 375/374 |
| 6,556,489 B2 | * | 4/2003 | Gomm et al. ................ 365/194 |
| 6,700,414 B2 | * | 3/2004 | Tsujino ............................ 327/3 |

* cited by examiner

Primary Examiner—Marc S. Hoff
Assistant Examiner—Paul L Kim
(74) Attorney, Agent, or Firm—Osha & May L.L.P.

(57) ABSTRACT

An apparatus for measuring static phase error in a delay locked loop includes a first test stage and a second test stage. The first test stage receives a reference clock, a chip clock, and a control signal. In parallel with the first test stage, the second test stage receives the reference clock, the chip clock, and a complement of the control signal. Dependent on the control signal, the first test stage outputs a first test signal, and, dependent on the complement of the control signal, the second test stage outputs a second test signal. The first test signal and the second test signal are used to generate a set of static phase error measurements dependent on values of the control signal and the complement of the control signal. By averaging the set of static phase error measurements, a static phase error is measured for the delay locked loop.

20 Claims, 6 Drawing Sheets

DLL STATIC PHASE ERROR MEASUREMENT TECHNIQUE

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having: a microprocessor (12), memory (14), integrated circuits (16) that have various functionalities, communication paths (18), i.e., buses and wires, that transfer data among the aforementioned components of the computer system (10), and a clock (20) that is used to synchronize operations of the computer system (10).

In order to properly accomplish such tasks, the computer system (10) relies on the basis of time to coordinate its various operations. To that end, the clock (20) generates a system clock signal (referred to and known in the art as a "reference clock") to various parts of the computer system (10). However, modern microprocessors and other integrated circuits are typically capable of operating at significantly higher frequencies, and thus, it becomes important to ensure that operations involving the microprocessor (12) and the other components of the computer system (10) use a proper and accurate reference of time.

One component used within the computer system (10) to ensure a proper reference of time among a system clock and a microprocessor clock, i.e., "chip clock," is an electronic circuit known as a delay locked loop, or "DLL." The DLL locks an input signal to an output signal such that a delay phase between the input signal and the output signal is fixed. A typical DLL (30) is shown in FIG. 2. In FIG. 2, the DLL (30) inputs a reference clock signal (shown as ref_clk) and outputs a chip clock signal (shown as chip_clk), where the reference clock and chip clock are phase aligned by the DLL (30). This relationship between the phases and frequencies of the reference clock and chip clock ensures that the various components within the microprocessor (12 in FIG. 1) use a controlled and accounted for reference of time.

The DLL (30) includes the following components: a phase-frequency detector (32), a charge pump/filter (34), and a voltage-controlled delay line (36). The phase-frequency detector (32) inputs the reference clock (ref_clk) and the chip clock (chip_clk), which is fed back from the output of the DLL (30). The phase-frequency detector (32) detects a difference between a phase of the reference clock and the chip clock. If a phase of the chip clock lags behind a corresponding phase of the reference clock, the phase-frequency detector (32) indicates to the rest of the DLL (30) that the chip clock needs to be sped up. This indication is given by generating an elongated pulse to the charge pump/filter (34) via a fast signal (shown as $fast_{13}$ pulse).

Alternatively, if a phase of the reference clock lags behind a corresponding phase of the chip clock, the phase-frequency detector (32) indicates to the rest of the DLL (30) that the chip clock needs to be slowed down. This indication is given by generating an elongated pulse to the charge pump/filter (34) via a slow signal (shown as $slow_{13}$ pulse). Those skilled in the art will note that when the DLL (30) is "in lock," there are still pulses on the fast and slow signals. However, in this case, i.e., when the DLL is "in lock," the fast and slow signal pulses are equal and relatively short.

The charge pump/filter (34), depending on the fast and slow signals from the phase-frequency detector (32), either dumps or removes charge to/from a voltage signal which is used by the voltage-controlled delay line (36) to generate the chip clock. The chip clock is then fed back to the input of the phase-frequency detector (32) for continued maintenance. In effect, the DLL (30) generates the chip clock such that it is phase aligned with the reference clock. When this phase relationship is maintained, i.e., when the DLL is "in lock," the timing of operations within a computer system occur as expected, and performance goals can be achieved. However, when this relationship is not maintained by the DLL (30), i.e., when the DLL (30) is "out of lock," the operations within the computer system (10 in FIG. 1) become indeterministic. Specifically, in some cases, operations may occur unexpectedly and cause computer system performance degradation.

One case in which a DLL may become "out of lock" is when there is a static phase error, i.e., an unchanging difference in phase, between the reference clock and the chip clock. In some cases, the static phase error may be caused by device variations, i.e., manufacturing variations, voltage variations, etc., in the design of the DLL. Accordingly, designers reduce static phase error by measuring and adjusting a design specification of the DLL such that an amount of static phase error introduced by device variations is minimized before the DLL is incorporated into the computer system (10 in FIG. 1). However, as modern microprocessors continue to operate at increasingly higher frequencies, measuring static phase error in a DLL becomes a more difficult task. In particular, the techniques and/or devices that are used to measure static phase error may contribute a large amount of error to the static phase error measurement, making the static phase error measurement inaccurate.

SUMMARY OF INVENTION

In one aspect, an apparatus for measuring static phase error in a delay locked loop comprises a first test stage arranged to receive a reference clock, a chip clock, and a control signal; and a second test stage arranged to receive the reference clock, the chip clock, and a complement of the control signal, wherein, dependent on the control signal, the first test stage outputs a first test signal, and wherein dependent on the complement of the control signal, the second test stage outputs a second test signal, wherein static phase error in the delay locked loop is determined dependent on the first test signal and the second test signal.

In another aspect, a system for measuring static phase error in a delay locked loop comprises delay locked means for generating a chip clock dependent on a reference clock; means for generating a first test signal and a second test signal dependent on the reference clock, the chip clock, and a control signal; means for comparing a phase of the first test signal to a phase of the second test signal; and means for determining a static phase error between the phase of the first test signal and the phase of the second test signal.

In another aspect, a method for measuring static phase error in a delay locked loop comprises generating a chip clock dependent on a reference clock; obtaining a first static phase error measurement between the chip clock and the reference clock dependent on a first value of a control signal; obtaining a second static phase error measurement between the chip clock and the reference clock dependent on a second value of the control signal; and measuring the static phase error in the delay locked loop by comparing a value of the first static phase error measurement and a value of the second static phase error measurement.

Other aspects and advantages of the invention will be apparent from the following description and the appended claims.

DETAILED DESCRIPTION

Figure 1:
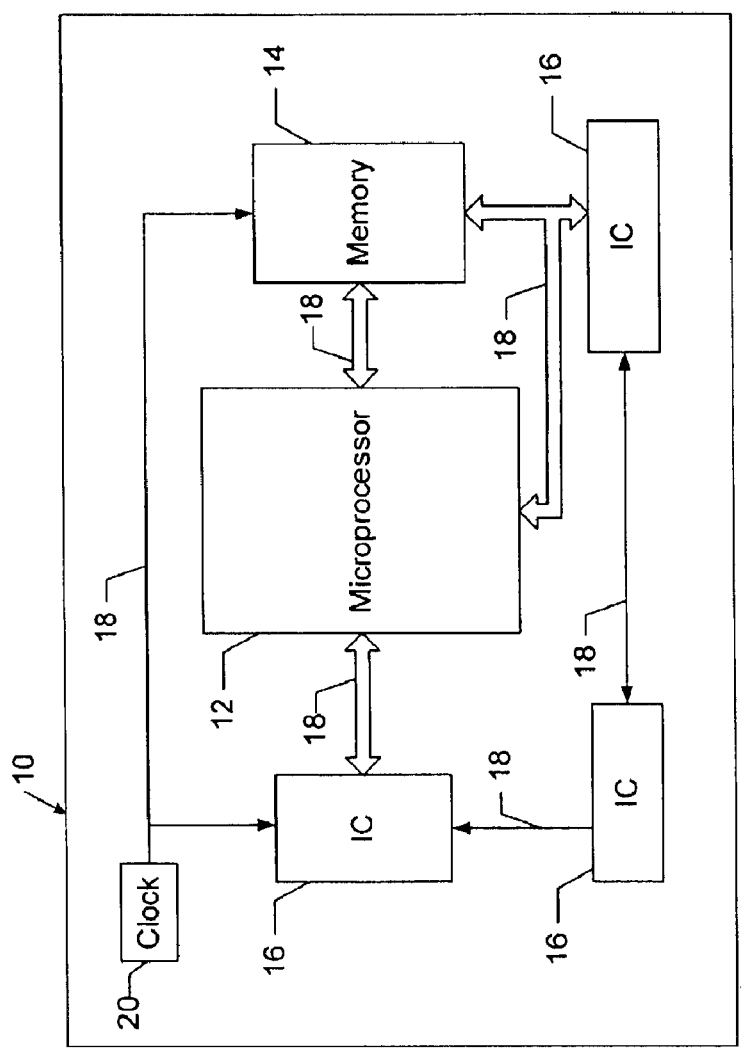
FIG. 1 shows a typical computer system.
Figure 2:
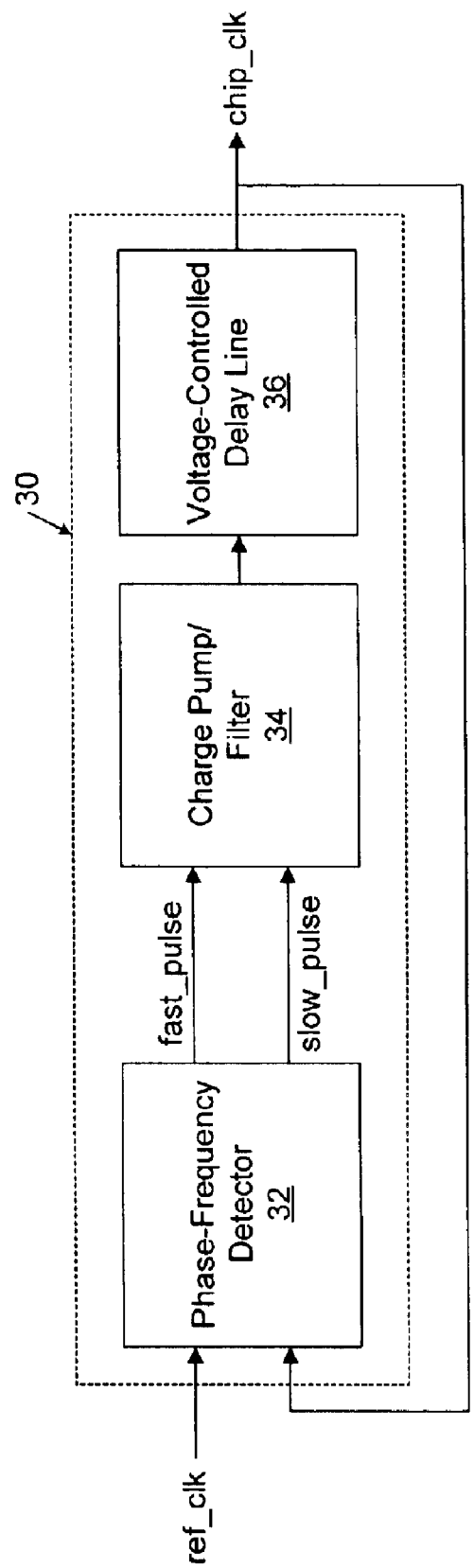
FIG. 2 shows a typical delay locked loop.

Embodiments of the present invention relate to a method and apparatus for measuring static phase error in a delay locked loop. Embodiments of the present invention further relate to a method for reducing inaccuracy in a static phase error measurement for a delay locked loop. Illustrative embodiments of the invention will now be described with reference to FIGS. 3–5 wherein like reference characters are used to denote like parts throughout the views.

Figure 3:
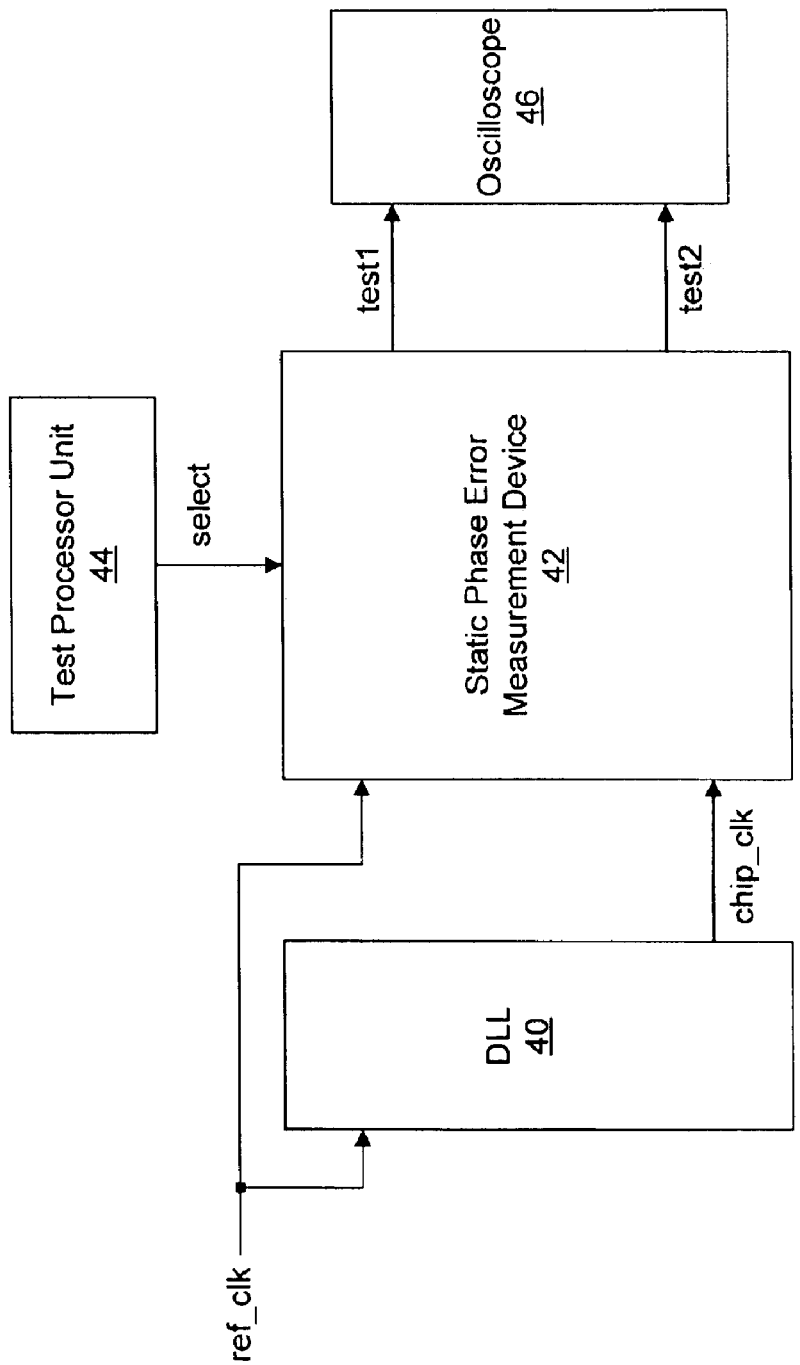
FIG. 3 shows a static phase error measurement technique in accordance with an embodiment of the present invention.

FIG. 3 shows an exemplary static phase error measurement technique in accordance with an embodiment of the present invention. In FIG. 3, a delay locked loop (DLL) (40) generates a chip clock signal (shown as chip_clk) based on an input reference clock signal (shown as ref_clk). The reference clock (ref_clk) and the chip clock (chip_clk) are both received by a static phase error measurement device (42). In addition, the static phase error measurement device (42) receives a control signal (shown as select) from a test processor unit (44), which may be included in a microprocessor (not shown) to test the operation of internal components such as a DLL.

Using select, the static phase error measurement device (42) generates a pair of phase measurements based on the values of ref_clk and chip_clk. The phase measurements are output by the static phase error measurement device (42) as a first test signal (shown as test1) and a second test signal (shown as test2). The first test signal (test1) and the second test signal (test2) each represent a clock phase measured for either the reference clock (ref_clk) or the chip clock (chip_clk). By comparing the phases of test1 and test2, a static phase offset, or error, may be determined for the DLL (40). In the embodiment shown, the static phase error is determined by inputting test1 and test2 to an oscilloscope (46) to generate a pair of visible simulation waveformns. The phases of the simulation waveforms seen on the oscilloscope (46) may then be compared to one another in order to determine the static phase error.

Figure 4:
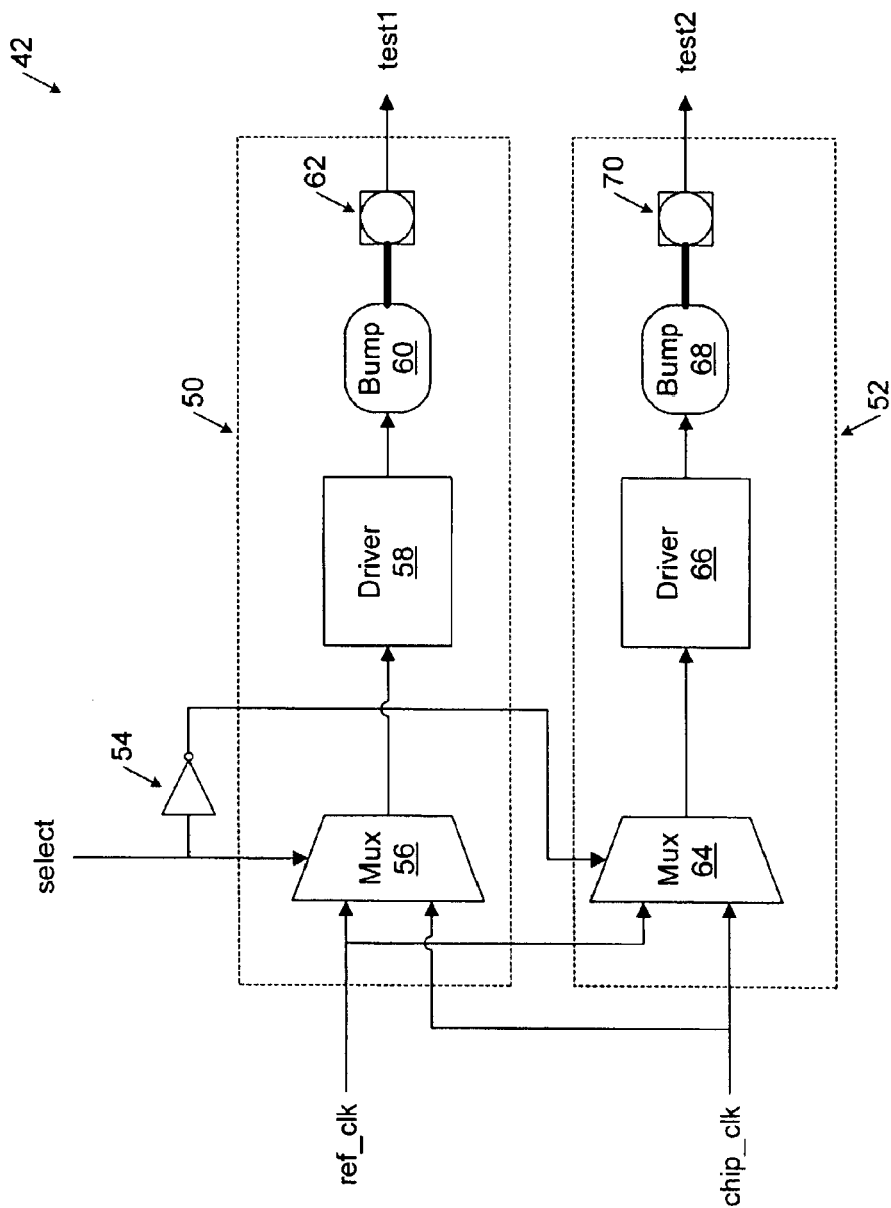
FIG. 4 shows a static phase error measurement device in accordance with an embodiment of the present invention.

FIG. 4 shows a schematic of an exemplary static phase error measurement device in accordance with an embodiment of the present invention. As shown in FIG. 4, the static phase error measurement device (42) includes a first test stage (50), a second test stage (52), and an inverter (54). The first test stage (50) inputs the reference clock (ref_clk), the chip clock (chip_clk), and the control signal (select) and outputs the first test signal (test1). The second test stage (52) inputs $ref_{13}$ clk, chip_clk, and a complement of select, and outputs the second test signal (test2). The inverter (54) is used to generate the complement of select, and, accordingly, is operatively connected to the second test stage (52).

The first test stage (50) includes the following circuitry: a multiplexer (mux) (56), a driver (58), a package bump (60), and an output pin (62). The mux (56) inputs the reference clock (ref_clk), the chip clock (chip_clk), and the control signal (select). Depending on the value of select, the mux (56) selects either ref_clk or chip_clk to output. In the embodiment shown, when select is low, the control signal received by the mux (56) is a low, and the signal selected for output by the mux (56) is the reference clock (ref_clk). When select is high, the control signal received by the mux (56) is a high, and the signal selected for output by the mux (56) is the chip clock (chip_clk).

Referring to FIG. 4, the signal selected for output by the mux (56) is input to the driver (58). In some embodiments, the driver (58) may be a buffer or an inverter. Using the signal received from the mux (56), the driver (58) generates the first test signal (test1). The first test signal (test1) is received by the package bump (60), which may be accessed by a device external to an integrated circuit (not shown) on which the static phase error measurement device (42) resides via the output pin (62). The output pin (62) is connected to the package bump (60) via a package trace, i.e., a thin connecting wire, and outputs the first test signal (test1). As mentioned above, test1 represents the clock phase of the signal selected for output by the mux (56).

The second test stage (52) includes the following circuitry: a mux (64), a driver (66), a package bump (68), and an output pin (70). The circuitry included in the second test stage (52) is configured in the manner described above for the first test stage (50) with the following exception. The selection operation of the mux (64) is not controlled by the select signal. Instead, the selection operation of the mux (64) is controlled by a complement of the select signal. Thus, when select is low, the control signal received by the mux (64) is a high, and the signal selected for output by the mux (64) is the chip clock (chip_clk), When select is high, the control signal received by the mux (64) is a low, and the signal selected for output by the mux (64) is the reference clock (ref_clk).

Note that, device variations inherent to the static phase error measurement device (42) ensure that both the first test signal (test1) and the second test signal (test22) include any phase error that may be respectively introduced by the components of the first test stage (50) and the components of the second test stage (52). As a result, each static phase measurement taken based on the first and second test signals (test1 and test2) includes a certain amount of phase error contributed by the static phase error measurement device (42).

In order to reduce inaccuracy in the static phase error measured for the DLL (40), the static phase error measurement technique of the present invention ensures that device variations present in each test stage (50, 52) are seen by both of the static phase error measurement device's input clock signals ($ref_{13}$ clk and chip_clk). Accordingly, as shown in the embodiment of FIGS. 4, a mux (56, 64) is included in each test stage (50, 52, respectively) to allow each input clock signal (ref_clk and chip_clk) to be driven through both test stages (50, 52).

Thus, in accordance with one or more embodiments, two static phase error measurements are taken in order to determine the static phase error of the DLL (40). For one of the static phase error measurements, select is set to high so that ref_clk is driven through the first test stage (50) and chip_clk is driven through the second test stage (52). For the other static phase error measurement, select is set to low so that ref_clk is driven through the second test stage (52) and chip_clk is driven through the first test stage (50). As a result, both ref_clk and chip_clk experience the phase error introduced by the distinct device variations of each test stage (50, 52). Accordingly, the inaccuracy contributed by the device variations may be canceled out of an average static phase error measurement by averaging the values of the two static phase error measurements taken.

Figure 5A:
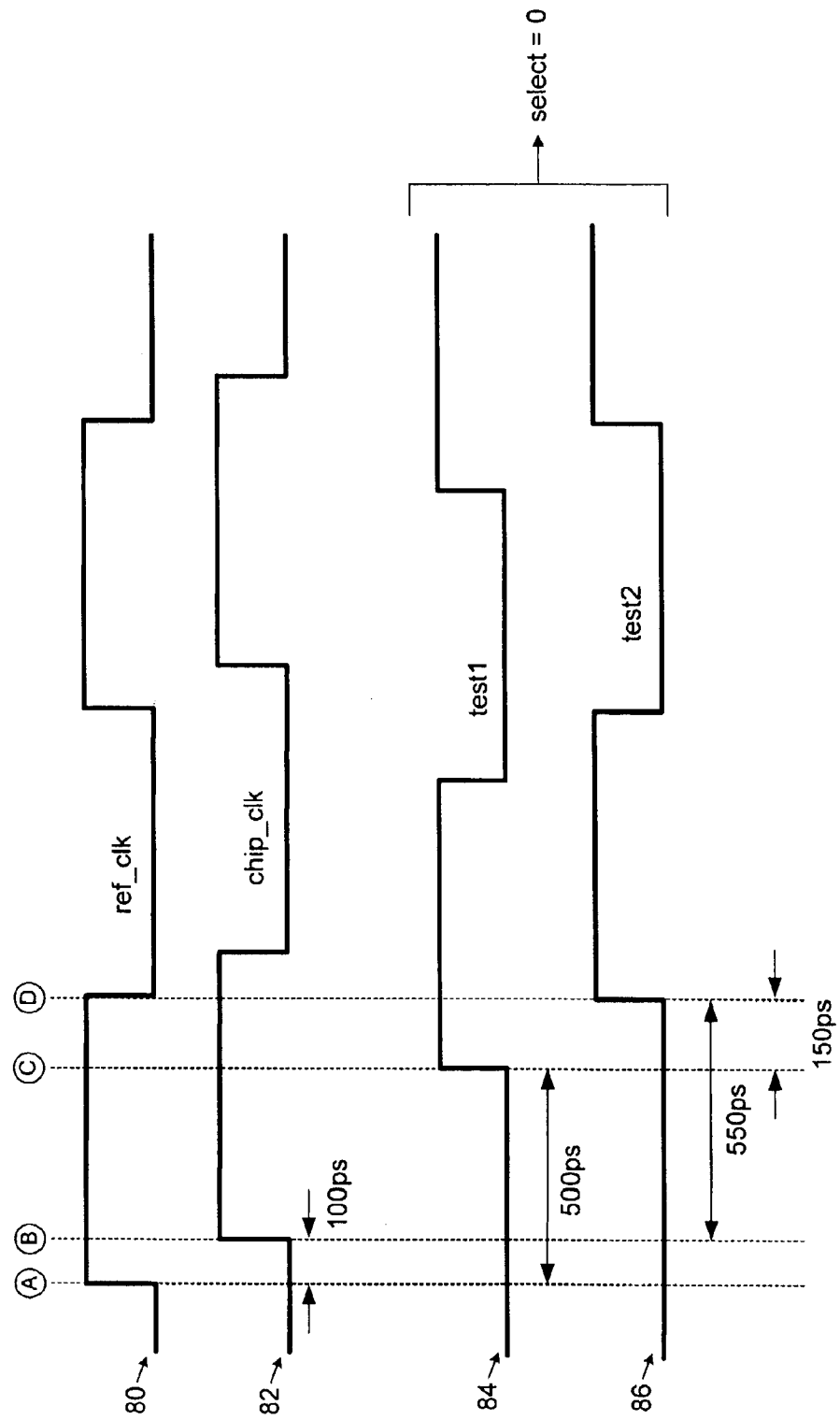
FIGS. 5a–5b show simulation waveforms in accordance with the embodiment shown in FIG. 4.
Figure 5B:
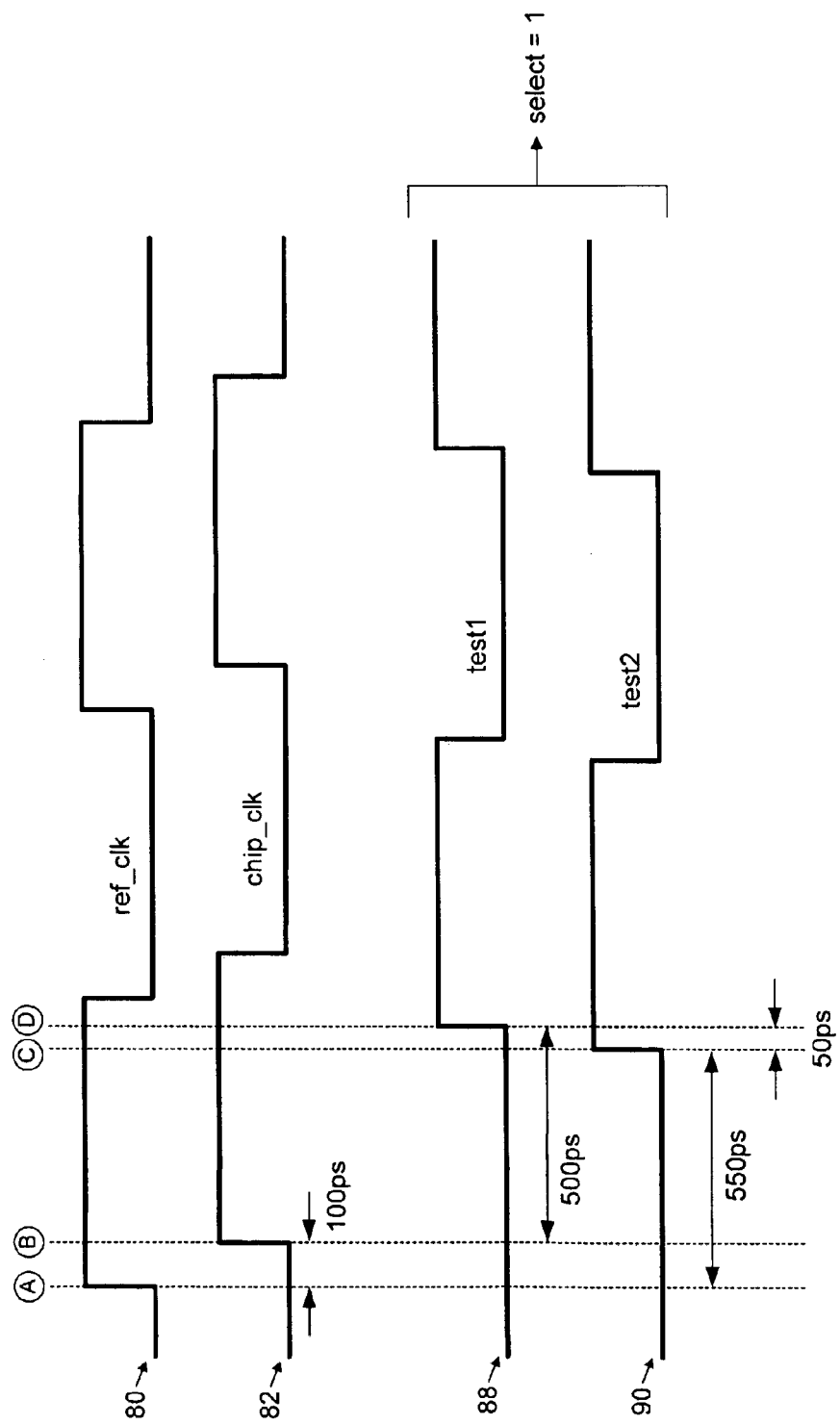

FIGS. 5a and 5b show exemplary simulation waveforms for static phase error measurements in accordance with the embodiment shown in FIG. 4. FIG. 5a shows simulation waveforms for a static phase error measurement taken during a time interval in which the value of the control signal (select) is set to a logical low. FIG. 5b shows simulation waveforms for a static phase error measurement taken during a time interval in which the value of select is set to a logical high.

In FIG. 5a, the following simulation waveforms are shown: a first waveform (80), a second waveform (82), a third waveform (84), and a fourth waveform (86). The first waveform (80) and the second waveform (82) respectively represent exemplary values of the reference clock (ref_clk) and the chip clock (chip_clk). The third waveform (84) and the fourth waveform (86) respectively represent the value of the first test signal (test1) and the value of the second test signal (test2) while select is set to low. Further, in FIG. 5a, points "A" through "D" represent different points in time during the time intervals in which the simulation waveforms are recorded.

As mentioned above, the third and fourth waveforms (84, 86) respectively represent the values of test1 and test2 when select is low. Accordingly, test1 is a phase measurement of ref_clk and test2 is a phase measurement of chip_clk. As can be seen from FIG. 5a, the first test stage (50 in FIG. 4) contributes 500 picoseconds (ps) of delay to test1, and the second test stage (52 in FIG. 4) contributes 550 ps of delay to test2. The time delay contributed by the first test stage (50 in FIG. 4) is indicated by the difference in time between time point "A" at the first waveform (80) (ref_clk) and time point "C" at the third waveform (84) (test1). The time delay contributed by the second test stage (52 in FIG. 4) is indicated by the difference in time between time point "B" at the second waveform (82) (chip_clk) and time point "D" at the fourth waveform (86) (test2).

As can also be seen from FIG. 5a, the static phase error between ref_clk and chip_clk is 100 ps and is indicated by the difference in time between time point "A" at ref_clk and time point "B" at chip_clk. Further, the static phase error between test1 and test2 is 150 ps and is indicated by the difference in time between time point "C" at test1 and time point "D" at test2. Note that, although the first waveform (80) and the second waveform (82) are included in FIG. 5a, the only waveforms that may seen by the oscilloscope (46 in FIG. 3) are the third waveform (84) and the fourth waveform (86). Accordingly, the static phase error measurement seen by the oscilloscope (46 in FIGS. 3) is 50 ps larger than the actual static phase error between ref_clk and chip_clk.

In FIG. 5b, the following simulation waveforms are shown: the first waveform (80), the second waveform (82), a fifth waveform (88), and a sixth waveform (90). As mentioned above, the first waveform (80) and the second waveform (82) respectively represent exemplary values of the reference clock (ref_clk) and the chip clock (chip_clk). The fifth waveform (88) and the sixth waveform (90) respectively represent the value of the first test signal (test1) and the value of the second test signal (test2) while select is set to high. Further, in FIG. 5b, points "A" through "D" represent different points in time during the time intervals in which the waveforms are recorded.

As mentioned above, the fifth and sixth waveforms (88, 90) respectively represent the values of test1 and test2 when select is high. Thus, test1 is a phase measurement of chip_clk and test2 is a phase measurement of ref_clk. As can be seen from FIG. 5b, the first test stage (50 in FIG. 4) contributes 500 picoseconds (ps) of delay to test1, and the second test stage (52 in FIG. 4) contributes 550 ps of delay to test2. The time delay contributed by the first test stage (50 in FIG. 4) is indicated by the difference in time between time point "B" at the second waveform (82) (chip_clk) and time point "D" at the fifth waveform (88) (test1). The time delay contributed by the second test stage (52 in FIG. 4) is indicated by the difference in time between time point "A" at the first waveform (80) (ref_clk) and time point "C" at the sixth waveform (90) (test2).

As can also be seen from FIG. 5b, the static phase error between ref_clk and chip_clk is 100 ps and is indicated by the difference in time between time point "A" at ref_clk and time point "B" at chip_clk. Further, the static phase error between test1 and test2 is 50 ps and is indicated by the difference in time between time point "C" at test2 and time point "D" at test1. Note that, although the first waveform (80) and the second waveform (82) are included in FIG. 5b, the only waveforms that may seen by the oscilloscope (46 in FIG. 3) are the fifth waveform (88) and the sixth waveform (90). Accordingly, the static phase error measurement seen by the oscilloscope (46 in FIGS. 3) is 50 ps smaller than the actual static phase error between ref_clk and chip_clk.

As described above, the actual static phase error between ref_clk and chip_clk may be determined from the static phase error measurements seen by the oscilloscope (46 in FIG. 3) by averaging the values of the static phase error measurements. Accordingly, the average of 150 ps and 50 ps is 100 ps, which is the actual value of the static phase error between ref_elk and chip_clk.

Although the present invention is used to measure static phase error in a DLL, those skilled in the art will appreciate that the static phase error measurement technique presented has multiple applications. For example, static phase error measurements taken may be used to measure the performance of a particular system design before the system is manufactured. Accordingly, the static phase error measurement technique may be used to modify the performance of the system design before the system is shipped to a customer in a potentially marginal state. Further, the static phase error measurement technique presented may be also used to measure static phase error in a phase locked loop or in any other system that uses feedback to control a phase of a signal.

Advantages of the present invention may include one or more of the following. In one or more embodiments, a static phase error measurement technique may ensure that a reference clock is driven through both test stages of the static phase error measurement device, and that a chip clock is driven through both test stages of a static phase error measurement device. Advantageously, device variations distinct to each test stage may be averaged out of a static phase error measured between the reference clock and the chip clock.

In one or more embodiments, a multiplexer controlled by an external control signal is included in a test stage of a static phase error measurement device. The multiplexer allows the test stage to take a phase measurement of both a reference clock and a chip clock. Thus, device variations present in the test stage are experienced by both the reference clock and the chip clock. Advantageously, device variations present in the test stage may be reduced in a static phase error measured between the reference clock and the chip clock.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for measuring static phase error in a delay locked loop, comprising:
   a first test stage arranged to input a reference clock, a chip clock, and a control signal; and
   a second test stage arranged to input the reference clock, the chip clock, and a complement of the control signal,
   wherein, dependent on the control signal, the first test stage outputs a first test signal, and wherein dependent on the complement of the control signal, the second test stage outputs a second test signal,
   wherein static phase error in the delay locked loop is determined dependent on the first test signal and the second test signal.

2. The apparatus of claim 1, wherein the chip clock is generated by the delay locked loop dependent on the reference clock.

3. The apparatus of claim 1, wherein the first test stage comprises:
   a multiplexer arranged to input the reference clock, the chip clock, and the control signal, wherein the multiplexer is arranged to output a clock signal selected from a group consisting of the reference clock and the chip clock dependent on the control signal;
   a driver arranged to input the clock signal and to generate the first test signal dependent on the clock signal;
   a package bump arranged to receive the first test signal; and
   an output pin operatively connected to the package bump and arranged to receive and output the first test signal.

4. The apparatus of claim 1, wherein the second driver stage comprises:
   a multiplexer arranged to input the reference clock, the chip clock, and the control signal, wherein the multiplexer is arranged to output a clock signal selected from a group consisting of the reference clock and the chip clock dependent on the complement of the control signal;
   a driver arranged to receive the clock signal and to generate the second test signal dependent on the clock signal;
   a package bump arranged to receive the second test signal; and
   an output pin operatively connected to the package bump and arranged to receive and output the second test signal.

5. The apparatus of claim 1, wherein the first test signal and the second test signal are received by an oscilloscope, and wherein the oscilloscope is arranged to generate simulation waveforms dependent on the first test signal and the second test signal.

6. The apparatus of claim 5, wherein a first static phase error measurement is generated using the simulation waveforms dependent on a first value of the control signal and a first value of the complement of the control signal.

7. The apparatus of claim 6, wherein a second static phase error measurement is generated using the simulation waveforms dependent on a second value of the control signal and a second value of the complement of the control signal.

8. The apparatus of claim 7, wherein a static phase error of the delay locked loop is measured by averaging the value of the first static phase error measurement with the value of the second static phase error measurement.

9. The apparatus of claim 1, wherein the control signal is generated by an external test processor unit.

10. A system for measuring static phase error in a delay locked loop, comprising:
    delay locked means for generating a chip clock dependent on a reference clock;
    means for generating a first test signal and a second test signal dependent on the reference clock, the chip clock, and a control signal;
    means for comparing a phase of the first test signal to a phase of the second test signal; and
    means for determining a static phase error between the phase of the first test signal and the phase of the second test signal.

11. The system of claim 10, wherein the means for generating comprises means for measuring a phase of the reference clock and a phase of the chip clock.

12. The system of claim 10, wherein the means for generating comprising:
    means for generating a first set of phase measurements dependent on values of the control signal; and
    means for generating a second set of phase measurements dependent on values of a complement of the control signal,
    wherein static phase error in the delay locked loop is determined dependent on the first set of phase measurements and the second set of phase measurements.

13. The system of claim 10, wherein the means for generating generates a first value of the first test signal and a first value of the second test signal dependent on a first value of the control signal, and wherein a first static phase error measurement is generated dependent on a comparison between the first value of the first test signal and the first value of the second test signal.

14. The system of claim 13, wherein the means for generating generates a second value of the first test signal and a second value of the second test signal dependent on a first value of the control signal, and wherein a second static phase error measurement is generated dependent on a comparison between the second value of the first test signal and the second value of the second test signal.

15. The system of claim 14, wherein a static phase error of the delay locked loop is determined dependent on a comparison between the first static phase error measurement and the second static phase error measurement.

16. The system of claim 10, further comprising testing means for generating the control signal.

17. A method for measuring static phase error in a delay locked loop, comprising:
    generating a chip clock dependent on a reference clock;
    obtaining a first static phase error measurement between the chip clock and the reference clock dependent on a first value of a control signal;
    obtaining a second static phase error measurement between the chip clock and the reference clock dependent on a second value of the control signal; and
    measuring the static phase error in the delay locked loop by comparing a value of the first static phase error measurement and a value of the second static phase error measurement.

18. The method of claim 17, wherein the obtaining the first static phase error measurement comprises:
    generating a first test signal dependent on the first value of the control signal and a first signal selected from a group consisting of a chip clock and a reference clock;
generating a second test signal dependent on a complement of the first value of the control signal and a second signal selected from the group consisting of the chip clock and the reference clock; and
comparing the first test signal and the second test signal to obtain the first static phase error measurement.

19. The method of claim 17, wherein the obtaining the second static phase error measurement comprises:
generating a first test signal dependent on the second value of the control signal and a first signal selected from a group consisting of a chip clock and a reference clock;
generating a second test signal dependent on a complement of the second value of the control signal and a second signal selected from the group consisting of the chip clock and the reference clock; and
comparing the first test signal and the second test signal to obtain the second static phase error measurement.

20. The method of claim 17, wherein the chip clock is generated by the delay locked loop.

* * * * *